(12) United States Patent
Yi et al.

(10) Patent No.: US 9,095,017 B2
(45) Date of Patent: Jul. 28, 2015

(54) ORGANIC LIGHT-EMITTING DISPLAY DEVICE

(71) Applicant: Samsung Display Co., Ltd., Yongin, Gyeonggi-Do (KR)

(72) Inventors: Chung Yi, Yongin (KR); Yong-Ho Yang, Yongin (KR); Chi-Wook An, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 13/789,442

(22) Filed: Mar. 7, 2013

(65) Prior Publication Data

US 2014/0055028 A1 Feb. 27, 2014

(30) Foreign Application Priority Data

Aug. 22, 2012 (KR) .................. 10-2012-0091993

(51) Int. Cl.
*H01L 51/52* (2006.01)
*H05B 33/04* (2006.01)
*H01L 27/32* (2006.01)

(52) U.S. Cl.
CPC .............. *H05B 33/04* (2013.01); *H01L 51/524* (2013.01); *H01L 51/5253* (2013.01); *H01L 27/323* (2013.01)

(58) Field of Classification Search
CPC .. H01L 51/5246; H01L 51/524; H01L 51/525
USPC ..................................... 313/498–512
See application file for complete search history.

(56) References Cited

U.S. PATENT DOCUMENTS

| | | | |
|---|---|---|---|
| 2002/0096995 A1* | 7/2002 | Mishima et al. | 313/506 |
| 2003/0124341 A1* | 7/2003 | Burroughes et al. | 428/332 |
| 2007/0159094 A1* | 7/2007 | Oh et al. | 313/512 |
| 2011/0316807 A1 | 12/2011 | Corrion | |
| 2013/0335822 A1* | 12/2013 | Yeh et al. | 359/483.01 |

FOREIGN PATENT DOCUMENTS

| | | |
|---|---|---|
| KR | 10-2010-0118870 A | 11/2010 |
| KR | 10-2011-0110944 A | 10/2011 |
| KR | 10-2012-0019268 A | 3/2012 |

\* cited by examiner

*Primary Examiner* — Anne Hines
(74) *Attorney, Agent, or Firm* — Christie, Parker & Hale, LLP (57) ABSTRACT

An organic light-emitting display device is provided. The organic light-emitting display device includes a substrate; a display unit on the substrate; and a sealing substrate on the display unit. The sealing substrate includes a first surface facing the display unit and a second surface opposite to the first surface. A first barrier layer is on the first surface or the second surface of the sealing substrate. Thus, the organic light-emitting display device may easily reduce or prevent penetration of external air and moisture.

18 Claims, 5 Drawing Sheets

ORGANIC LIGHT-EMITTING DISPLAY DEVICE

CROSS-REFERENCE TO RELATED PATENT APPLICATION

This application claims priority to and the benefit of Korean Patent Application No. 10-2012-0091993, filed on Aug. 22, 2012 in the Korean Intellectual Property Office, the entire content of which is incorporated herein by reference.

BACKGROUND

1. Field

Aspects of embodiments of the present invention relate to a display device, and more particularly, to an organic light-emitting display device.

2. Description of the Related Art

Organic light-emitting display devices are self-emitting display devices. Organic light-emitting display devices have features such as a wide viewing angle, high contrast, and a fast response time. Thus, organic light-emitting display devices have drawn much attention because they may be used in mobile display devices such as a digital camera, a video camera, a camcorder, a portable information terminal, a smart phone, an ultra-slim notebook, and a tablet personal computer, or in electronic products such as an ultra-slim television.

Recently, flexible display devices have drawn attention as a next-generation display device. In addition, research into flexible display devices that may be used in electronic devices having various shapes has been conducted. Among these, flexible display devices based on organic light-emitting display technology have been most notable. Research into flexible display devices with various touch panel functions is being conducted to improve user convenience. Such flexible display devices can be damaged or have their display quality degraded by penetration of external air and moisture.

SUMMARY

Aspects of embodiments of the present invention relate to a display device, and more particularly, to an organic light-emitting display device that reduces or prevents penetration of external air and moisture. Embodiments of the present invention provide for an organic light-emitting display device in which at least one barrier layer is disposed at a sealing substrate to reduce or prevent penetration of external air and moisture.

According to an exemplary embodiment of the present invention, an organic light-emitting display device is provided. The organic light-emitting display device includes a substrate, a display unit on the substrate, and a sealing substrate on the display unit. The sealing substrate includes a first surface facing the display unit and a second surface opposite to the first surface. A first barrier layer is on the first surface or the second surface of the sealing substrate.

The first barrier layer may be selected from the group consisting of an inorganic thin film layer, an organic thin film layer, an organic/inorganic composite thin film layer, and an inorganic/metal/organic composite thin film layer.

The first barrier layer may have a single-layered structure or a multi-layered structure.

The inorganic thin film layer may be selected from the group consisting of SiOx, SiNx, SiON, AlO, and AlON.

The organic thin film layer may include acryl or polyimide.

The metal thin film layer may be selected from the group consisting of Au, Ag, Cu, Ni, Pt, Pd, Al, Mo, and Cr.

The organic light-emitting display device may include a touch screen on the sealing substrate. The touch screen may include first and second electrode pattern units, and an insulating layer for insulating the first electrode pattern units from the second electrode pattern units.

The touch screen may be coupled to the second surface of the sealing substrate with the first barrier layer therebetween.

The touch screen may be on the second surface of the sealing substrate. The first barrier layer may be the insulating layer.

The touch screen may be coupled to the second surface of the sealing substrate. The first barrier layer may be on the first surface of the sealing substrate.

The display unit may include a plurality of first and second elements and at least one insulating layer for insulating the first elements from the second elements. The first barrier layer may be the insulating layer. One of the at least one insulating layer is a second barrier layer that is between the substrate and the display unit.

The first electrode pattern units may be spaced apart from one another in a first direction of the touch screen. The second electrode pattern units may be spaced apart from one another in a second direction crossing the first direction of the touch screen.

The first electrode pattern units and the second electrode pattern units may be patterned in a same layer. The first electrode pattern units and the second electrode pattern units may be buried in the insulating layer.

The insulating layer may have contact holes corresponding to where the first electrode pattern units and the second electrode pattern units cross each other. Adjacent ones of the first electrode pattern units in the first direction of the touch screen may be electrically connected to one another by first connection units. Adjacent ones of the second electrode pattern units in the second direction of the touch screen may be electrically connected to one another by second connection units each having ends extending in a vertical direction through the contact holes and contacting the second electrode pattern units.

The organic light-emitting display device may further include a passivation layer on the insulating layer to cover the second connection units.

The first electrode pattern units and the second electrode pattern units may include transparent conductive material selected from the group consisting of ITO, IZO, ZnO, and $In_2O_3$.

The first barrier layer may be between the first surface of the sealing substrate and the display unit.

A second barrier layer may be between the substrate and the display unit.

The display unit may include: a thin film transistor (TFT) on the substrate, the TFT including a first device and a second device; an insulating layer for insulating the first device from the second device; and an organic light-emitting device connected to the TFT and including a first electrode, a second electrode, and an organic layer between the first electrode and the second electrode.

The organic light-emitting display device may further include an integrated-type on-cell touch screen panel on the sealing substrate. The touch screen panel may include a touch screen selected from the group consisting of capacitive type, resistive type, electro-magnetic type, saw type, and infrared type touch screens.

BRIEF DESCRIPTION OF THE DRAWINGS

The above and other features and aspects of the present invention will become more apparent by describing in detail exemplary embodiments thereof with reference to the attached drawings in which.

DETAILED DESCRIPTION

As the present invention allows for various changes and numerous embodiments, particular embodiments will be illustrated in the drawings and described in detail in the written description. However, this is not intended to limit the present invention to particular modes of practice, and it is to be appreciated that all changes, equivalents, and substitutes that do not depart from the spirit and technical scope of the present invention are encompassed in the invention. In the description of the present invention, certain detailed explanations of related art are omitted when they may unnecessarily obscure the description of the invention.

While such terms as "first," "second," etc., may be used to describe various components, such components should not be limited to the above terms. The above terms are used primarily to distinguish one component from another. The terms used in the present specification are used to describe particular embodiments, and are not intended to limit the present invention. An expression used in the singular encompasses the expression of the plural, unless it has a clearly different meaning in the context. In the present specification, terms such as "including" or "having," etc., are intended to indicate the existence of features, numbers, steps, actions, components, parts, or combinations thereof disclosed in the specification, and are not intended to preclude the possibility that one or more other features, numbers, steps, actions, components, parts, or combinations thereof may exist or may be added.

An organic light-emitting display device according to embodiments of the invention will be described below in more detail with reference to the accompanying drawings. Those components that are the same or are in correspondence are rendered the same reference numeral regardless of the figure number, and redundant explanations may not be repeated. As used herein, the term "and/or" includes any combinations of one or more of the associated listed items. Expressions such as "at least one of," when preceding a list of elements, modify the entire list of elements and do not modify the individual elements of the list.

Figure 1:
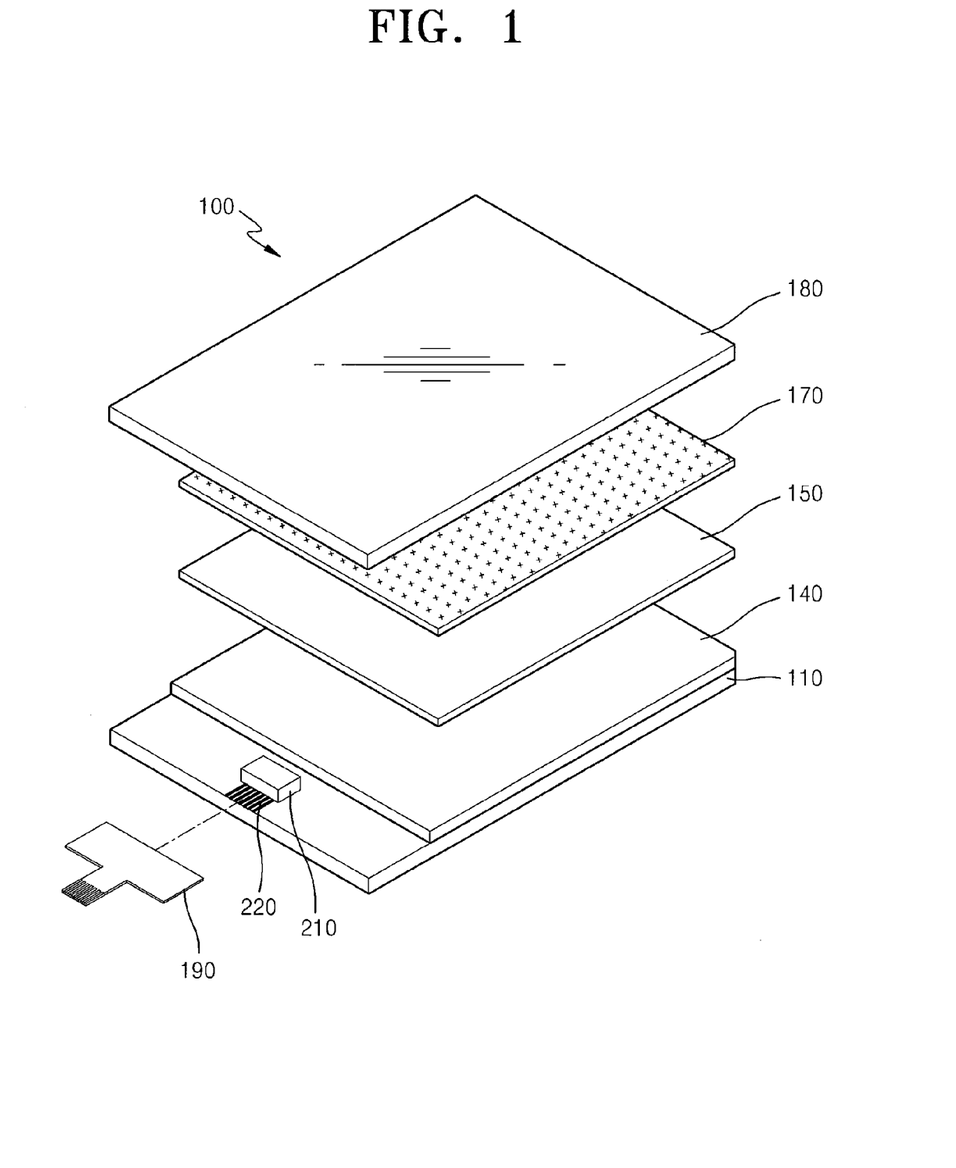
FIG. 1 is an exploded perspective view of an organic light-emitting display device according to an embodiment of the present invention.
Figure 2:
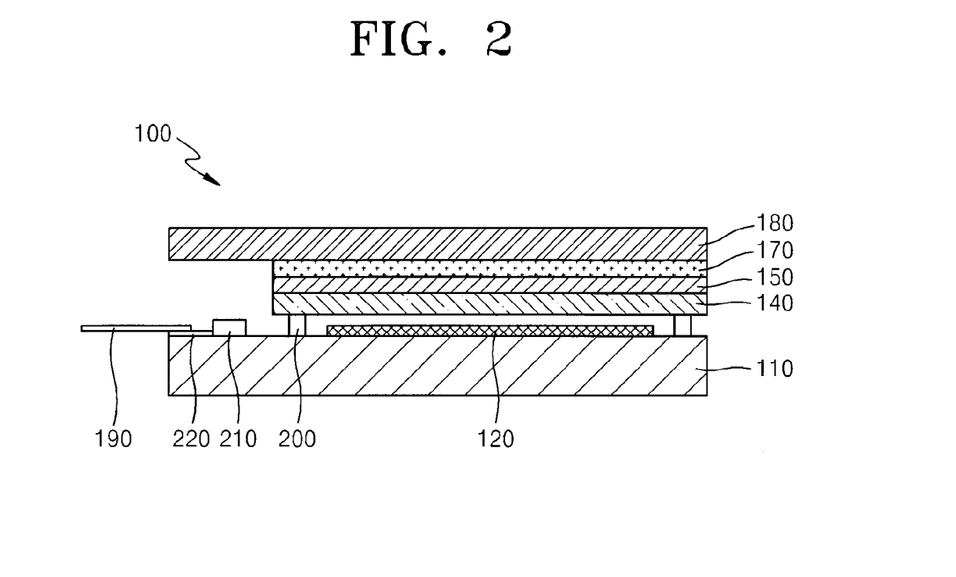
FIG. 2 is a cross-sectional view of the organic light-emitting display device of FIG. 1.

FIG. 1 is an exploded perspective view of an organic light-emitting display device 100 according to an embodiment of the present invention. FIG. 2 is a cross-sectional view of the organic light-emitting display device 100 of FIG. 1.

Referring to FIGS. 1 and 2, a substrate 110 is prepared in the organic light-emitting display device 100. The substrate 110 may be, for example, a thin film formed of glass or a polymer resin. In the current embodiment, the substrate 110 is a flexible substrate. A display unit 120 through which an image is displayed is formed on the substrate 110. The display unit 120 includes at least one thin film transistor (TFT) and an organic light-emitting diode (OLED). However, the present invention is not limited thereto, and in other embodiments, various display devices may be used as the display unit 120.

A sealing substrate 140 for sealing an upper portion of the substrate 110 is formed above the display unit 120, with the display unit between the substrate 110 and the sealing substrate 140. The sealing substrate 140 may be, for example, a thin film formed of glass or a polymer resin. In the current embodiment, the sealing substrate 140 is a flexible substrate. A cell seal 200 for sealing a region occupied by the display unit 120 is formed in a portion (for example, an edge portion) between the substrate 110 and the sealing substrate 140. The cell seal 200 is formed along edges of the substrate 110 and the sealing substrate 140.

A touch screen 150 is formed on the sealing substrate 140. The touch screen 150 is an on-cell touch screen panel (TSP) in which a touch screen pattern is formed on the sealing substrate 140. The touch screen 150 may be integrally formed on the sealing substrate 140. A polarizing plate 170 is formed on the touch screen 150. The polarizing plate 170 reduces or prevents external light from being reflected from the display unit 120. A window cover 180 is formed on the polarizing plate 170.

A display driver integrated chip (IC) 210 for driving the display unit 120 is disposed (for example, located) at an edge of the substrate 110. The display driver IC 210 is electrically connected to a circuit substrate 190 via a connection line 220. The circuit substrate 190 may be a flexible printed circuit board (FPC).

Figure 3:
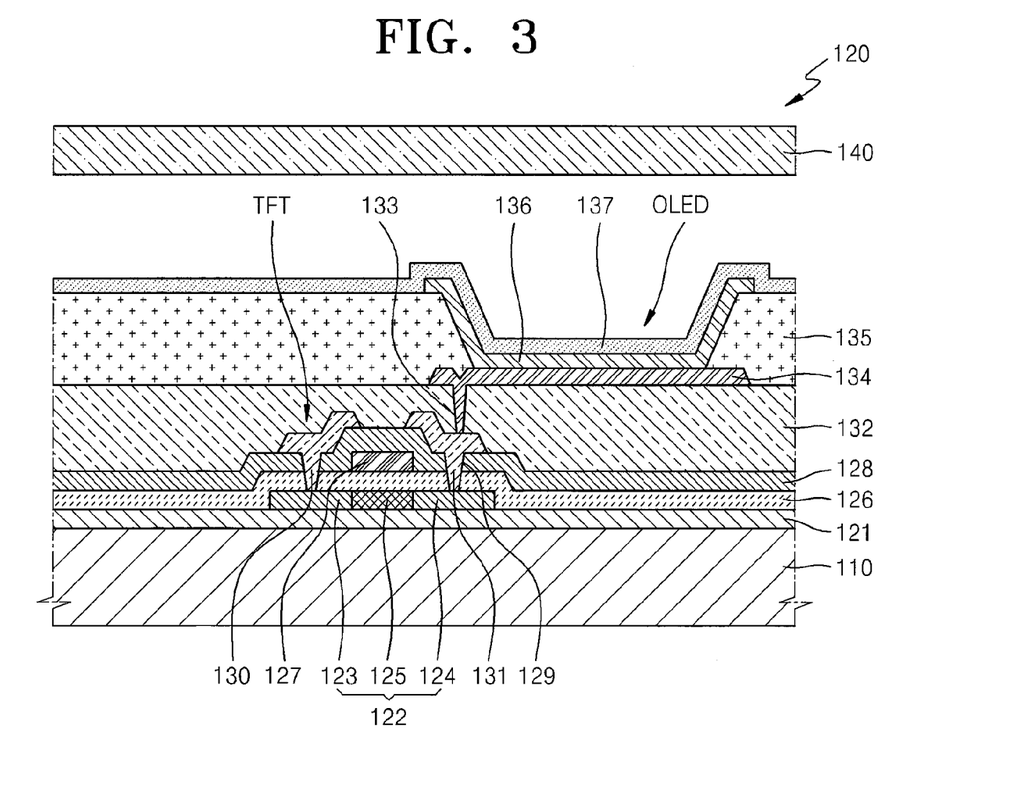
FIG. 3 is a cross-sectional view of a sub-pixel of a display unit shown in FIG. 2.

FIG. 3 is a cross-sectional view of a sub-pixel of the display unit 120 shown in FIG. 2.

Although the display unit 120 is an organic light-emitting display unit, other display units, such as a liquid-crystal display (LCD) unit, a field emission display unit, a plasma display unit, an electroluminescence display unit, or an electrophoretic display unit, may be used as the display unit 120. Referring to FIG. 3, the display unit 120 is formed on the substrate 110. The substrate 110 is a flexible substrate. The substrate 110 may be formed of a high molecular material that has a smaller specific gravity than a glass substrate and is unbreakable and flexible, for example, a flexible plastic film. As a thickness of the substrate 110 decreases, the organic light-emitting display device 100 may be easily made light and thin. The substrate 110 should have a thickness in which the substrate 110 may withstand the weight of elements and thin film layers formed on the substrate 110 during manufacturing of the substrate 110.

For this, the substrate 110 may be a thin film-type substrate with a thickness between about 10 μm and 100 μm. When the substrate 110 has a thickness less than 10 μm, the shapes of the device and the thin film layers formed on the substrate 110 may not be stably maintained during the manufacturing of the substrate 110. When the substrate 110 has a thickness greater than 100 μm, it may be difficult to maintain flexibility of the substrate 110. The substrate 110 may be formed of a high molecular weight material such as polyimide (PI), polycarbonate (PC), polyethersulfon (PES), polyethylene terephthalate (PET), polyethylenenaphthalate (PEN), polyarylate (PAR), or fiber glass reinforced plastic (FRP).

A barrier layer 121 is formed on the substrate 110. The barrier layer 121 may be formed of: an inorganic material such as SiOx, SiNx, SiON, AlO, or AlON; an organic material such as acryl or polyimide; or an organic/inorganic composite material alternately stacked upon one another. The barrier layer 121 may reduce or prevent penetration of oxygen or moisture, reduce or prevent diffusion of impurity materials, and/or adjust a transmission speed of heat during crystallization to facilitate crystallization of a semiconductor.

A TFT is formed on the barrier layer 121. Although the TFT of the current embodiment is a top gate-type TFT, in other embodiments, a TFT having any of other structures (for example, a bottom gate-type TFT) may be used. A semiconductor active layer 122 is formed on the barrier layer 121. When the semiconductor active layer 122 is formed of poly-silicon, amorphous silicon is formed and is then crystallized into poly-silicon.

The amorphous silicon may be crystallized by using any of various methods, for example, a rapid thermal annealing (RTA) method, a solid phase crystallization (SPC) method, an excimer laser annealing (ELA) method, a metal induced crystallization (MIC) method, a metal induced lateral crystallization (MILC) method, a sequential lateral solidification (SLS) method, and the like. However, it may be preferable that a method not requiring a high-temperature heating process be selected in order to avoid damaging the substrate 110 (such as when the substrate 110 is made of a high molecular weight material). For example, during crystallization using a low temperature poly-silicon (LTPS), the semiconductor active layer 122 may be formed by radiating a laser for a short period of time to reduce the time during which the substrate 110 is exposed to high temperature (for example, a temperature of 300° C. or higher), thereby performing the entire process at a lower temperature (for example, a temperature of 300° C. or lower). Thus, the TFT may be formed by using the substrate 110 formed of the high molecular weight material.

A source region 123 and a drain region 124 are formed by doping N-type or P-type impurity ions on the semiconductor active layer 122. A region between the source region 123 and the drain region 124 is a channel region 125 not doped with impurity ions. A gate insulating layer 126 is coated on the semiconductor active layer 122. The gate insulating layer 126 may be formed, for example, as a single-layered structure formed of $SiO_2$ or a double-layered structure formed of $SiO_2$ and $SiN_x$.

A gate electrode 127 is formed on a set region (for example, a predetermined region) of the gate insulating layer 126. The gate electrode 127 is connected to a gate line for applying ON/OFF signals of the TFT. The gate electrode 127 may be formed of a single or a plurality of metals. Further, the gate electrode 127 may be formed as a single-layered structure including any one of Mo, MoW, Cr, Al, Mg, Ni, W, and Au or a compound thereof, or as a multi-layered structure including two or more such layers.

An insulating interlayer 128 is formed on the gate electrode 127. A source electrode 130 is electrically connected to the source region 123. A drain electrode 131 is electrically connected to the drain region 124 via a contact hole 129. The insulating interlayer 128 may be formed of an insulating material such as $SiO_2$ or $SiN_x$, or may be formed of an insulating organic material. The contact hole 129 may be formed by selectively removing a part of the gate insulating layer 126 and a part of the insulating interlayer 128. A similar contact hole may be formed to electrically connect the source electrode 130 to the source region 123, as illustrated in FIG. 3.

A passivation layer (or planarization layer) 132 is formed on the source electrode 130 and the drain electrode 131. The passivation layer 132 may protect and planarize the TFT formed below the passivation layer 132. The passivation layer 132 may be configured as any of various forms. The passivation layer 132 may be formed of an organic material such as benzocyclobutent (BCB) or acryl, or an inorganic material such as SiNx. Further, the passivation layer 132 may be formed to have any of various structures, such as a single-, double-, or other multi-layered structure.

A display device is formed on the TFT. Although the OLED is shown in the current embodiment, the present invention is not limited thereto, and in other embodiments, any of various display devices may be used. In order to form an organic light-emitting device on the TFT, a first electrode 134 may be electrically connected to one electrode of the source electrode 130 or the drain electrode 131 via a contact hole 133. For example, in FIG. 3, the first electrode 134 is shown electrically connected to the drain electrode 131 via the contact hole 133.

The first electrode 134 serves as an anode of electrodes included in the organic light-emitting device, and may be formed of any of various conductive materials. The first electrode 134 may be formed as a transparent or reflective electrode according to organic light-emitting devices. For example, when the first electrode 134 is formed as a transparent electrode, the first electrode 134 may include indium tin oxide (ITO), indium zinc oxide (IZO), zinc oxide (ZnO), $In_2O_3$, or the like. When the first electrode 134 is formed as a reflective electrode, a reflective layer is formed of one of Ag, Mg, Al, Pt, Pd, Au, Ni, Nd, Ir, Cr or a compound thereof, and then one or more of ITO, IZO, ZnO, and $In_2O_3$ may be formed thereon.

A pixel defining layer (PDL) 135 formed of an organic material is formed on the passivation layer 132 to partially cover the first electrode 134 of the organic light-emitting device. An organic layer 136 is formed on a part of the first electrode 134 that is exposed to the outside by etching a part of the pixel defining layer 135. A second electrode 137 of the organic light-emitting device is formed on the organic layer 136. The first electrode 134 and the second electrode 137 are insulated from each other by the organic layer 136. Different polarities of voltages may be applied to the organic layer 136 to allow the organic layer 136 to emit light.

Although in the embodiment of FIG. 3, the organic layer 136 is patterned to correspond to each sub-pixel (that is, the organic layer 136 is patterned in a similar layout as the first electrode 134), this is for convenience of description of a configuration of the sub-pixel. In other embodiments, for example, the organic layer 136 may be formed integrally with the organic layer 136 of an adjacent sub-pixel. In addition, the organic layer 136 may be formed in various ways. For example, the organic layer may include a plurality of organic layers, where some of the organic layers 136 may be formed to correspond to the respective sub-pixels, and the others of the organic layers 136 may be formed integrally with the organic layer 136 of the adjacent sub-pixel.

The organic layer 136 may be formed of a low or high molecular organic material. When the organic layer 136 is formed of a low molecular organic material, the organic layer 136 may be formed as a single-layered structure including a hole injection layer (HIL), a hole transport layer (HTL), an emission layer (EML), an electron transport layer (ETL), or an electron injection layer (EIL), or may be formed as a multi-layer in which the above-mentioned layers are stacked on one another. In addition, examples of organic materials of the organic layer 136 may include copper phthalocyanine (CuPc), N,N'-di(naphthalene-1-yl)-N,N'-diphenyl-benzidine (NPB), tris-8-hydroxyquinoline aluminum (Alq3), and the like. The above-described low molecular organic material may be formed by, for example, vacuum deposition using masks.

When the organic layer 136 is formed of a high molecular organic material, the organic layer 136 may have a structure including the HTL and the EML. Here, the HTL may use poly(3,4-ethylenedioxythiophene) (PEDOT), and the EML may use poly-phenylenevinylene (PPV)- or polyfluorene-based high organic material. The high organic material may be formed, for example, by screen printing or inkjet printing. However, the present invention is not limited thereto, and in other embodiments, any of various methods may be used.

The second electrode 137 may be formed as a transparent or reflective electrode (similar to the first electrode 134). When the second electrode 137 is formed as a transparent electrode, the second electrode 137 may be formed by depositing a metal with a low work function such as Li, Ca, LiF/Ca, LiF/Al, Al, Mg, or a compound thereof on the organic layer 136, and then forming an auxiliary electrode on the metal. The auxiliary electrode may be formed of a material for forming a transparent electrode such as ITO, IZO, ZnO, or $In_2O_3$. When the second electrode 137 is formed as a reflective electrode, the second electrode 137 is formed by entirely depositing one of Li, Ca, LiF/Ca, LiF/Al, Al, Mg, or a compound thereof.

When the first electrode 134 is a transparent electrode or a reflective electrode, the first electrode 134 may be formed to have a shape corresponding to a shape of an opening of each sub-pixel. The second electrode 137 may be formed by depositing a transparent electrode or a reflective electrode on the entire display area. In addition, the second electrode 137 may not be necessarily deposited on the entire display area. For example, the second electrode 137 may be formed in any of various patterns. Here, positions of the first electrode 134 and the second electrode 137 may be reversed.

The sealing substrate 140 is coupled to the top portion of the organic light-emitting device. The sealing substrate 140 may be formed of a material that is substantially the same as the material of the substrate 110. The sealing substrate 140 may be a flexible film. In other embodiments, the sealing substrate 140 may seal the organic light-emitting device by manufacturing the organic light-emitting device and then forming an organic and/or inorganic film on the organic light-emitting device.

Figure 4:
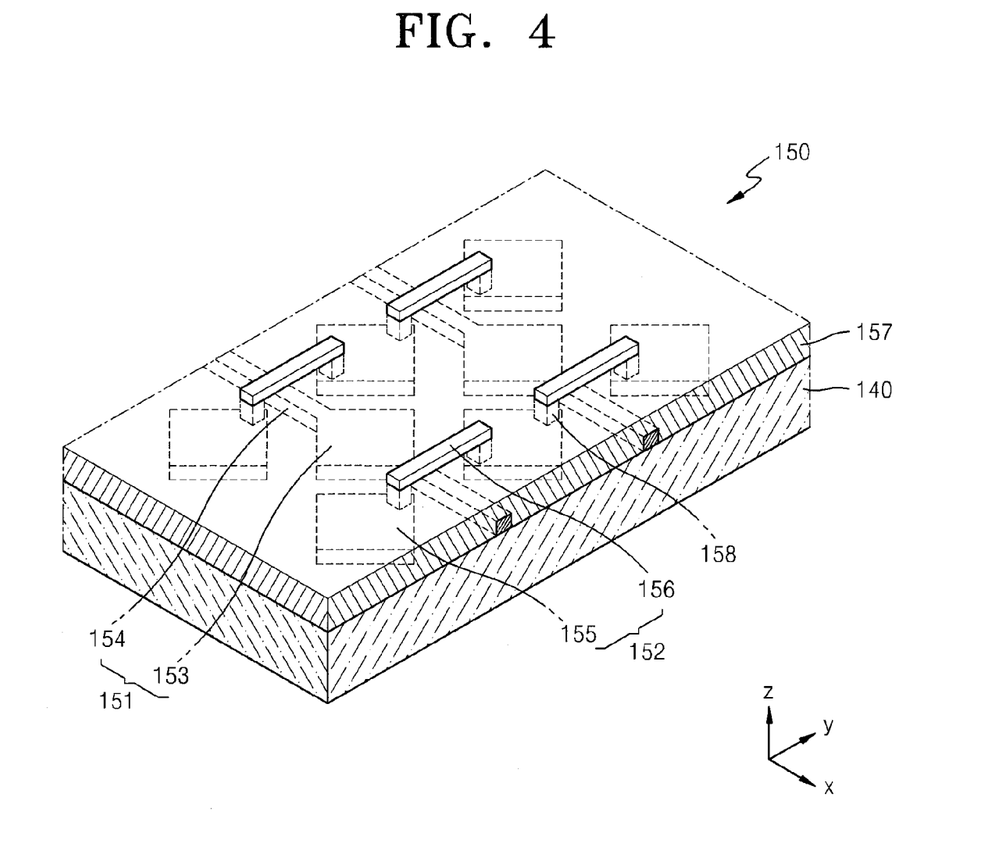
FIG. 4 is a perspective view of a touch screen shown in FIG. 1.

FIG. 4 is a perspective view of the touch screen 150 shown in FIG. 1.

Although the touch screen 150 is an electrostatic capacitive type touch screen in the current embodiment, the present invention is not limited thereto. In other embodiments, the touch screen 150 may be one selected from the group consisting of resistive type, electro-magnetic type, saw type, and infrared type touch screens. Referring to FIG. 4, the touch screen 150 is formed on the sealing substrate 140 (as also depicted in FIG. 1). In the current embodiment of FIG. 4, although the touch screen 150 is an integrated type in which the touch screen 150 is directly formed on the sealing substrate 140, the touch screen 150 may be formed on a substrate that is separately formed, for example, a flexible touch substrate.

A plurality of first electrode pattern units 151 and a plurality of second electrode pattern units 152 are alternately disposed on the sealing substrate 140. The first electrode pattern units 151 are formed in parallel such that edges of the first electrode pattern units 151 contact one another in a first direction (x-axis direction) of the sealing substrate 140. Each of the second electrode pattern units 152 is disposed between rows of adjacent first electrode pattern units 151. The second electrode pattern units 152 are disposed in parallel such that edges of the second electrode pattern units 152 contact one another in a second direction (y-axis direction).

In the exemplary embodiment of FIG. 4, the first electrode pattern units 151 include a plurality of first bodies 153 and a plurality of first connection units 154 electrically connecting the first bodies 153 in units of rows. The first bodies 153 are formed in a diamond shape. The first bodies 153 are formed in a line (or row) in the first direction (x-axis direction) of the sealing substrate 140. Each of the first connection units 154 is formed between a pair of first bodies 153 that are arranged adjacent to each other in the first direction (x-axis direction). Each such first connection unit 154 thus connects two of the first bodies 153.

Likewise, the second electrode pattern units 152 include a plurality of second bodies 155 and a plurality of second connection units 156 electrically connecting the second bodies 155 in units of columns. The second bodies 155 are also formed in a diamond shape. The second bodies 155 are formed in a line (or column) in the second direction (y-axis direction). Each of the second connection units 156 connects two of the second bodies 155.

Here, adjacent first electrode pattern units 151 (in the first direction) are connected to each other by the first connection units 154 disposed on the same plane. On the other hand, adjacent second electrode pattern units 152 (in the second direction) are connected to each other by the second connection units 156 disposed on a different plane to avoid interference with the first electrode pattern units 151.

In more detail, an insulating layer 157 covering the first electrode pattern units 151 and the second bodies 155 is formed on the sealing substrate 140. The insulating layer 157 insulates the first electrode pattern units 151 and the second electrode pattern units 152 from one another. A plurality of contact holes 158 are formed in the insulating layer 157. The contact holes 158 are formed to correspond to edge portions of the second bodies 155 where adjacent second bodies 155 (in the second direction) face each other. In other words, the contact holes 158 are formed in regions where rows of the first electrode pattern units 151 and columns of the second electrode pattern units 152 cross each other.

The second connection units 156 are arranged in the second direction on the insulating layer 157. Both ends of each of the second connection units 156 extend in a vertical direction (that is, buried in the insulating layer 157) via the contact holes 158. Each end of the second connection unit 156 contacts an upper surface of one of the second bodies 155. Thus, the second connection unit 156 electrically connects two adjacent second electrode pattern units 152 in the second direction.

The first electrode pattern units 151 and the second electrode pattern units 152 having the above-described structure are formed of a transparent material, such as ITO, IZO, ZnO, or $In_2O_3$. In addition, the first electrode pattern units 151 and the second electrode pattern units 152 may be formed by using a photolithography process. For example, the first electrode pattern units 151 and the second electrode pattern units 152 may be formed by patterning a transparent conductive layer formed by, for example, deposition, spin coating, sputtering, or inkjet. Meanwhile, a passivation layer may further be formed on the insulating layer 157 to cover the second connection units 156 for connecting the second electrode pattern units 152.

If an input device such as a finger approaches or contacts the sealing substrate 140, the touch screen 150 having the above-described structure detects a touch operation by measuring capacitance varying between the first electrode pattern units 151 and the second electrode pattern units 152. Accordingly, a touch panel function may be realized without increasing a thickness of the organic light-emitting display device 100. In addition, since the organic light-emitting display device 100 is an on-cell TSP in which the touch screen 150 is installed on an external surface of the sealing substrate 140, even under a strong external light, an amount of reflection may be reduced and thus, a clear screen may be realized. Here, a barrier layer is formed on a surface of the sealing substrate 140 to reduce or prevent penetration of external air or moisture, details of which will now be described.

Figure 5:
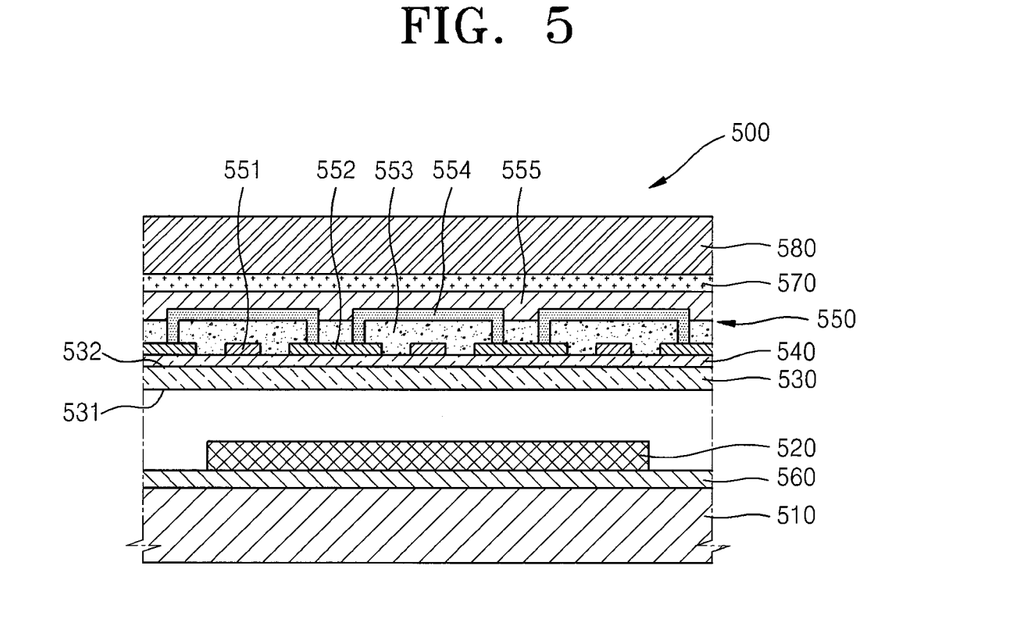
FIG. 5 is a partial cross-sectional view of an organic light-emitting display device in which a barrier layer is formed, according to an embodiment of the present invention.

FIG. 5 is a partial cross-sectional view of an organic light-emitting display device 500 in which a barrier layer is formed, according to an embodiment of the present invention.

Referring to FIG. 5, the organic light-emitting display device 500 includes a substrate 510 and a second barrier layer 560 formed on the substrate 510. The substrate 510 is a thin film substrate formed of glass or a polymer resin. The substrate 510 may be a flexible plastic film. The second barrier layer 560 corresponds to the barrier layer 121 shown in FIG. 3. The second barrier layer 560 may be formed, for example, of: an inorganic material such as SiOx, SiNx, SiON, AlO, or AlON; an organic material such as acryl or polyimide; or an organic/inorganic composite material alternately stacked upon one another.

A display unit 520 (in which a plurality of elements and a thin film layer are formed) is formed on the second barrier layer 560 to display an image. A sealing substrate 530 for sealing an upper portion of the substrate 510 is located over the display unit 520. The sealing substrate 530 may be formed of rigid glass or a thin film layer in which an organic material and an inorganic material are alternately stacked on each other at least once. In the current embodiment, the sealing substrate 530 is formed of a flexible plastic film, and may be formed of a material that is substantially the same as the substrate 510. A first barrier layer 540 is formed on the sealing substrate 530.

The sealing substrate 530 includes a first surface 531 facing the display unit 520 and a second surface 532 opposite to the first surface 531. The first barrier layer 540 is formed (for example, directly formed) on the second surface 532 of the sealing substrate 530. The first barrier layer 540 is formed to reduce or prevent external air or moisture from penetrating the sealing substrate 530. The first barrier layer 540 may be formed of a material that is substantially the same as the second barrier layer 560.

For example, the first barrier layer 540 may be formed as: a thin film layer formed of a single inorganic material such as SiOx, SiNx, SiON, AlO, or AlON; a thin film layer formed of an organic material such as acryl or polyimide; or a multi-layered structure including different organic thin film layers. Alternately, the first barrier layer 540 may be formed to have a structure in which at least one inorganic thin film layer and at least one organic thin film layer are alternately stacked on one another. In addition, the first barrier layer 540 may be formed as a multi-layer in which an inorganic thin film layer, a metal thin film layer, and an organic thin film layer are stacked on one another. Here, the metal thin film layer may be used as an intermediate layer instead of an uppermost layer. The metal thin film layer may be formed of a metal such as Au, Ag, Cu, Ni, Pt, Pd, Al, Mo, or Cr, or an alloy thereof.

A touch screen 550 is formed on the first barrier layer 540. The touch screen 550 includes a plurality of first electrode pattern units 551 arranged in one direction (for example, a first direction) of the substrate 510 and a plurality of second electrode pattern units 552 arranged in another direction (for example, a second direction). Patterns of the first electrode pattern units 551 and the second electrode pattern units 552 are substantially the same as those of the first electrode pattern units 151 and the second electrode pattern units 152, respectively, shown in FIG. 4, and thus a detailed description thereof will not be repeated here. The first electrode pattern units 551 and the second electrode pattern units 552 having the above-described structures are formed of a transparent conductive layer, for example, a transparent material such as ITO, IZO, ZnO, or $In_2O_3$.

The first electrode pattern units 551 and the second electrode pattern units 552 are insulated from one another by an insulating layer 553. Adjacent second electrode pattern units 552 (in the second direction) are connected to each other by second connection units 554 disposed on a different plane to avoid interference with the first electrode pattern units 551 formed on the same plane. The second connection units 554 are covered by a passivation layer 555. The passivation layer 555 is formed on the insulating layer 553.

As described above, the organic light-emitting display device 500 has an on-cell TSP structure in which the first electrode pattern units 551 and the second electrode pattern units 552 are integrally formed outside of the sealing substrate 530 by interposing the first barrier layer 540 therebetween. In addition, a polarizing plate 570 is adhered to an outer surface of the touch screen 550, and a window cover 580 is installed above the polarizing plate 570.

As such, in the current embodiment, the organic light-emitting display device 500 has a structure in which the substrate 510 having flexibility (for example, a flexible plastic film) and the sealing substrate 530 are coupled to each other. In addition, the second barrier layer 560 is formed on a surface of the substrate 510 disposed at a lower side of the display unit 520, while the first barrier layer 540 is formed on the second surface 532 of the sealing substrate 530 disposed at an upper side of the display unit 520. Accordingly, the first barrier layer 540 may reduce or effectively prevent external air or moisture from penetrating a region where the display unit 520 is formed.

Instead of forming the first barrier layer 540 separately, at least one layer of the insulating layer 553 (formed of an insulating material) and the passivation layer 555 that are formed in the touch screen 550 may serve as the first barrier layer 540. Here, since the insulating layer 553 formed at a lower side of the touch screen 550 may be directly formed on the second surface 532 of the sealing substrate 530, the insulating layer 553 may serve as the first barrier layer 540 instead of the passivation layer 555. When the insulating layer 553 or the passivation layer 555 serves as a barrier layer, the insulating layer 553 or the passivation layer 555 may be formed as: a thin film layer formed of a single inorganic material such as SiOx, SiNx, SiON, AlO, or AlON; a multi-layered structure in which different inorganic thin film layers are stacked on one another; a thin film layer formed of a single organic material such as acryl or polyimide; a multi-layered structure in which different organic thin film layers are stacked on one another; or a structure in which at least one inorganic thin film layer and at least one organic thin film layer are alternately stacked on one another.

Figure 6:
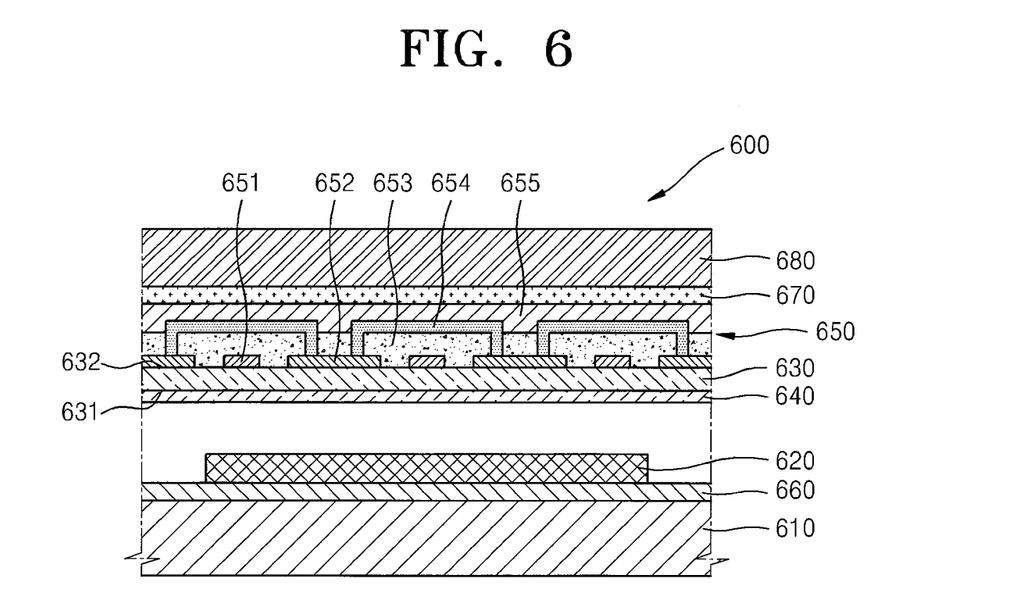
FIG. 6 is a partial cross-sectional view of an organic light-emitting display device in which a barrier layer is formed, according to another embodiment of the present invention.

FIG. 6 is a partial cross-sectional view of an organic light-emitting display device 600 in which a barrier layer is formed, according to another embodiment of the present invention.

Referring to FIG. 6, the organic light-emitting display device 600 includes a substrate 610 and a second barrier layer 660 formed on the substrate 610. A display unit 620 is formed on the second barrier layer 660. The substrate 610 is formed of a flexible material. The second barrier layer 660 corresponds to the second barrier layer 560 shown in FIG. 5, and may be formed of an inorganic material, an organic material, or an organic/inorganic composite material alternately stacked upon one another.

A sealing substrate 630 is formed on the display unit 620. The sealing substrate 630 is formed of a flexible material, and may be formed of a material that is substantially the same material as that of the substrate 610. The sealing substrate 630 includes a first surface 631 facing the display unit 620 and a second surface 632 opposite to the first surface 631.

A first barrier layer 640 is formed on the first surface 631. The first barrier layer 640 is formed as: a thin film layer formed of a single inorganic material such as SiOx, SiNx, SiON, AlO, or AlON; a multi-layer in which different inorganic thin film layers are stacked on one another; a thin film layer formed of an organic material such as acryl or polyimide; a multi-layer in which different organic thin film layers are stacked on one another; or a multi-layer in which at least one inorganic thin film layer and at least one organic thin film layer are alternately stacked on one another. In addition, the first barrier layer 640 may be formed to have a multi-layered structure in which an inorganic thin film layer, an organic thin film layer, and a metal thin film layer are stacked on one another. The metal thin film layer may be formed of a metal such as Au, Ag, Cu, Ni, Pt, Pd, Al, Mo, Cr, or an alloy thereof.

A touch screen 650 is formed on the second surface 632 of the sealing substrate 630. The touch screen 650 includes a plurality of first electrode pattern units 651 arranged in one direction (for example, a first direction) of the substrate 610, a plurality of second electrode pattern units 652 arranged in another direction (for example, a second direction) of the substrate 610, an insulating layer 653 for insulating the first electrode pattern units 651 and the second electrode pattern units 652 from one another, and a passivation layer 655 covering second connection units 654 for connecting adjacent second electrode pattern units 652 (in the second direction). A polarizing plate 670 is adhered to an outer surface of the touch screen 650. A window cover 680 is installed above the polarizing plate 670.

Unlike the embodiment of FIG. 5, in which the first barrier layer 540 is formed on the second surface 532 of the sealing substrate 530, in FIG. 6, the first barrier layer 640 of the current embodiment is formed on the first surface 631 of the sealing substrate 630. In addition, the touch screen 650 is formed on the second surface 632 of the sealing substrate 630 to have an on-cell TSP structure.

Figure 7:
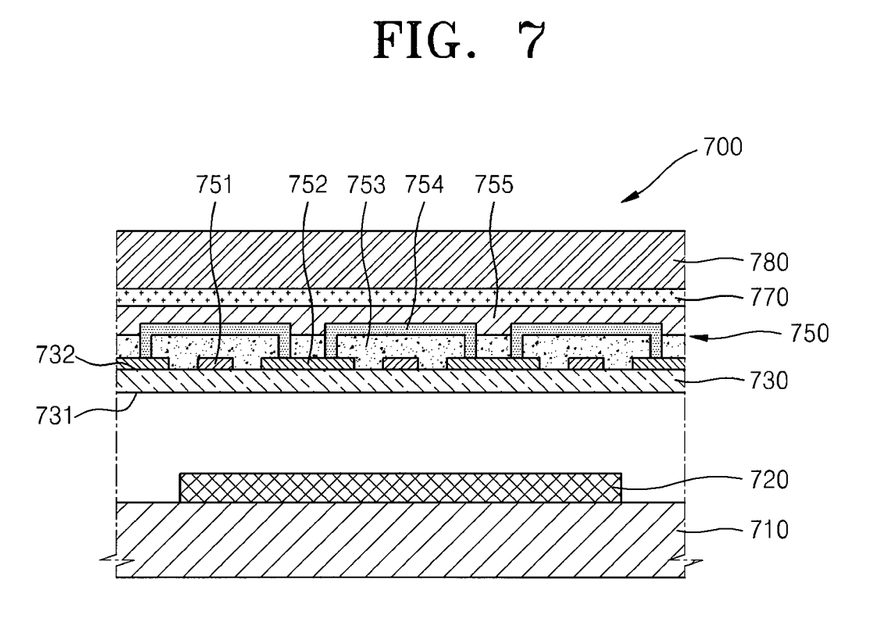
FIG. 7 is a partial cross-sectional view of an organic light-emitting display device in which a barrier layer is formed, according to another embodiment of the present invention.

FIG. 7 is a partial cross-sectional view of an organic light-emitting display device 700 in which a barrier layer is formed, according to another embodiment of the present invention.

Referring to FIG. 7, the organic light-emitting display device 700 includes a substrate 710 and a display unit 720 formed on the substrate 710. The substrate 710 is formed of a flexible material. The display unit 720 includes at least one TFT and an organic light-emitting device similar to the display unit 120 shown in FIG. 3. In addition, the display unit 720 includes a plurality of elements, such as a semiconductor active layer, a gate insulating layer, a gate electrode, an insulating interlayer, a source electrode, a drain electrode, a passivation layer, a pixel defining layer, a first electrode, an organic layer, a second electrode, and one or more insulating layers.

A sealing substrate 730 is disposed on the display unit 720. The sealing substrate 730 is formed of a flexible material and may be formed of a material that is substantially the same as the substrate 710. The sealing substrate 730 includes a first surface 731 facing the display unit 720 and a second surface 732 opposite to the first surface 731.

A touch screen 750 is formed on the second surface 732 of the sealing substrate 730. The touch screen 750 includes a plurality of first electrode pattern units 751 arranged in one direction (for example, a first direction) of the substrate 710, a plurality of second electrode pattern units 752 arranged in another direction (for example, a second direction) of the substrate 710, an insulating layer 753 for insulating the first electrode pattern units 751 and the second electrode pattern units 752 from one another, and a passivation layer 755 covering second connection units 754 for connecting adjacent second electrode pattern units 752 (in the second direction). A polarizing plate 770 is adhered to an outer surface of the touch screen 750. A window cover 780 is installed above the polarizing plate 770.

Here, unlike the embodiments shown in FIGS. 5 and 6, in the current embodiment of FIG. 7, a barrier layer is not separately formed on one surface of the substrate 710 and one surface of the sealing substrate 730. Instead, at least one insulating layer from among the insulating layers included in the display unit 720 and the touch screen 750 serve as a barrier layer.

In other words, any one insulating layer from among the insulating layers that are included in the display unit 720 and that insulate devices may serve as a second barrier layer. Here, the insulating layer is disposed in a region between the substrate 710 and the display unit 720. In addition, any one insulating layer from among the insulating layer 753 and the passivation layer 755 serves as a first barrier layer.

As such, in the organic light-emitting display device 700 of the current embodiment, the insulating layers included in the display unit 720 and the touch screen 750 serve as barrier layers. In addition, the touch screen 750 is disposed on the second surface 732 of the sealing substrate 730 to have an on-cell TSP structure.

As described above, in exemplary embodiments of the organic light-emitting display device, a barrier layer is formed on one surface of a sealing substrate to reduce or prevent penetration of external air and moisture. In addition, a touch unit is integrally formed on the sealing substrate so that a touch panel function may be realized without increasing a thickness of the organic light-emitting display device.

While the present invention has been particularly shown and described with reference to exemplary embodiments thereof, it will be understood by those of ordinary skill in the art that various changes in form and details may be made therein without departing from the spirit and scope of the present invention as defined by the following claims, and equivalents thereof.

What is claimed is:
1. An organic light-emitting display device comprising:
 a substrate;
 a display unit on the substrate;
 a sealing substrate on the display unit; and
 a touch screen on the sealing substrate, the touch screen comprising:
  first and second electrode pattern units; and
  an insulating layer for insulating the first electrode pattern units from the second electrode pattern units,
 wherein the sealing substrate comprises a first surface facing the display unit and a second surface opposite to the first surface,
 wherein a first barrier layer is between the first surface of the sealing substrate and the display unit, wherein a second barrier layer is between the substrate and the display unit, and
wherein the touch screen is on the second surface of the sealing substrate.

2. The organic light-emitting display device of claim 1, wherein the display unit comprises:
a thin film transistor (TFT) on the substrate, the TFT comprising a first device and a second device;
an insulating layer for insulating the first device from the second device; and
an organic light-emitting device connected to the TFT and comprising a first electrode, a second electrode, and an organic layer between the first electrode and the second electrode.

3. The organic light-emitting display device of claim 1, further comprising an integrated-type on-cell touch screen panel on the sealing substrate, wherein the touch screen panel comprises the touch screen selected from the group consisting of capacitive type, resistive type, electro-magnetic type, saw type, and infrared type touch screens.

4. An organic light-emitting display device comprising:
a substrate;
a display unit on the substrate, the display unit comprising a thin film transistor (TFT) on the substrate and an organic light-emitting device connected to the TFT; and
a sealing substrate on the display unit,
wherein the sealing substrate comprises a first surface facing the display unit and a second surface opposite to the first surface,
wherein a first barrier layer is on the first surface or the second surface of the sealing substrate,
wherein the first barrier layer is selected from the group consisting of an inorganic thin film layer, an organic thin film layer, an organic/inorganic composite thin film layer comprising the organic thin film layer and the inorganic thin film layer, and an inorganic/metal/organic composite thin film layer comprising the inorganic thin film layer, a metal thin film layer, and the organic thin film layer,
wherein a second barrier layer is between the substrate and the display unit, and
wherein a touch screen is coupled to the second surface of the sealing substrate, the touch screen comprising:
first and second electrode pattern units; and
an insulating layer for insulating the first electrode pattern units from the second electrode pattern units.

5. The organic light-emitting display device of claim 4, wherein the first barrier layer has a single-layered structure or a multi-layered structure.

6. The organic light-emitting display device of claim 4, wherein
the first barrier layer is selected from the group consisting of the inorganic thin film layer, the organic/inorganic composite thin film layer, and the inorganic/metal/organic composite thin film layer, and
the inorganic thin film layer is selected from the group consisting of SiOx, SiNx, SiON, AlO, and AlON.

7. The organic light-emitting display device of claim 4, wherein
the first barrier layer is selected from the group consisting of the organic thin film layer, the organic/inorganic composite thin film layer, and the inorganic/metal/organic composite thin film layer, and
the organic thin film layer comprises acryl or polyimide.

8. The organic light-emitting display device of claim 4, wherein the first barrier layer is the inorganic/metal/organic composite thin film layer, and
the metal thin film layer is selected from the group consisting of Au, Ag, Cu, Ni, Pt, Pd, Al, Mo, and Cr.

9. An organic light-emitting display device comprising:
a substrate;
a display unit on the substrate;
a sealing substrate on the display unit; and
a touch screen on the sealing substrate, the touch screen comprising:
first and second electrode pattern units; and
an insulating layer for insulating the first electrode pattern units from the second electrode pattern units,
wherein the sealing substrate comprises a first surface facing the display unit and a second surface opposite to the first surface,
wherein a first barrier layer is on the first surface or the second surface of the sealing substrate, and
wherein the first barrier layer is the insulating layer.

10. The organic light-emitting display device of claim 9, wherein the touch screen is coupled to the second surface of the sealing substrate with the first barrier layer therebetween.

11. The organic light-emitting display device of claim 9, wherein the touch screen is on the second surface of the sealing substrate.

12. The organic light-emitting display device of claim 9, wherein
the touch screen is coupled to the second surface of the sealing substrate, and
the first barrier layer is on the first surface of the sealing substrate.

13. The organic light-emitting display device of claim 9, wherein:
the display unit comprises a plurality of first and second elements and at least one insulating layer for insulating the first elements from the second elements; and
one of the at least one insulating layer is a second barrier layer that is between the substrate and the display unit.

14. The organic light-emitting display device of claim 9, wherein:
the first electrode pattern units are spaced apart from one another in a first direction of the touch screen; and
the second electrode pattern units are spaced apart from one another in a second direction crossing the first direction of the touch screen.

15. The organic light-emitting display device of claim 14, wherein
the first electrode pattern units and the second electrode pattern units are patterned in a same layer, and
the first electrode pattern units and the second electrode pattern units are buried in the insulating layer.

16. The organic light-emitting display device of claim 15, wherein:
the insulating layer has contact holes corresponding to where the first electrode pattern units and the second electrode pattern units cross each other;
adjacent ones of the first electrode pattern units in the first direction of the touch screen are electrically connected to one another by first connection units; and
adjacent ones of the second electrode pattern units in the second direction of the touch screen are electrically connected to one another by second connection units each having ends extending in a vertical direction through the contact holes and contacting the second electrode pattern units.

17. The organic light-emitting display device of claim 16, further comprising a passivation layer on the insulating layer to cover the second connection units.

18. The organic light-emitting display device of claim 14, wherein the first electrode pattern units and the second electrode pattern units comprise transparent conductive material selected from the group consisting of ITO, IZO, ZnO, and $In_2O_3$.

* * * * *